(12) United States Patent
Trembley

(10) Patent No.: US 7,062,678 B2
(45) Date of Patent: Jun. 13, 2006

(54) DIAGNOSTIC MEMORY INTERFACE TEST

(75) Inventor: Matthew Trembley, Grayson, GA (US)

(73) Assignee: LSi Logic Corporation, Milpitas, CA (US)

( * ) Notice: Subject to any disclaimer, the term of this patent is extended or adjusted under 35 U.S.C. 154(b) by 563 days.

(21) Appl. No.: 10/214,864

(22) Filed: Aug. 6, 2002

(65) Prior Publication Data

US 2004/0030955 A1 Feb. 12, 2004

(51) Int. Cl.
*G06F 11/00* (2006.01)
(52) U.S. Cl. .................................. 714/32; 714/738
(58) Field of Classification Search ............ 714/32, 714/42, 719, 720, 33; 710/307, 66
See application file for complete search history.

(56) References Cited

U.S. PATENT DOCUMENTS

| | | | | |
|---|---|---|---|---|
| 4,816,750 A | * | 3/1989 | Van der Kloot et al. ... | 324/73.1 |
| 5,479,413 A | * | 12/1995 | Sicola et al. ............... | 714/718 |
| 5,533,194 A | * | 7/1996 | Albin et al. ................ | 714/42 |
| 5,668,815 A | * | 9/1997 | Gittinger et al. ........... | 714/719 |
| 5,677,913 A | * | 10/1997 | Aybay ....................... | 714/720 |
| 6,286,116 B1 | * | 9/2001 | Bhavsar ..................... | 714/720 |
| 6,360,342 B1 | * | 3/2002 | Lee et al. ................... | 714/718 |
| 6,550,034 B1 | * | 4/2003 | Riedlinger et al. ......... | 714/733 |
| 6,647,522 B1 | * | 11/2003 | Nakahara et al. .......... | 714/720 |
| 6,704,677 B1 | * | 3/2004 | Ho ............................ | 702/119 |
| 6,711,706 B1 | * | 3/2004 | Douskey et al. ........... | 714/724 |
| 6,760,872 B1 | * | 7/2004 | Gupta et al. ............... | 714/719 |
| 6,874,110 B1 | * | 3/2005 | Camarota ................... | 714/733 |

\* cited by examiner

*Primary Examiner*—Scott Baderman
*Assistant Examiner*—Gabriel L. Chu
(74) *Attorney, Agent, or Firm*—Cochran Freund & Young, LLC

(57) ABSTRACT

Disclosed is a test method for a computer microprocessor adapted to stress the data transfer interfaces within a microprocessor. The method incorporates patterns designed to stress the interfaces and are further repeated in different widths such that interfaces of various bus widths are fully stressed. Further, the method begins with the various test patterns preloaded into memory to maximize the speed and thus the stress of the test.

16 Claims, 6 Drawing Sheets

Functional Block Diagram of a CPU 202 4 Bit 'Walking 1' Pattern
```
0001
0010
0100
1000
```

FIGURE 2A

204 8 Bit 'Walking 1' Pattern
```
00000001
00000010
00000100
00001000
00010000
00100000
01000000
10000000
```

FIGURE 2B

206 4 Bit 'Walking 0' Pattern
```
1110
1101
1011
0111
```

FIGURE 2C

208 8 Bit 'Walking 0' Pattern
```
11111110
11111101
11111011
11110111
11101111
11011111
10111111
01111111
```

FIGURE 2D

210 4 Bit 'A5' Pattern

| Binary | Hex |
|---|---|
| 1010 | A |
| 0101 | 5 |
| 1010 | A |
| 0101 | 5 |

FIGURE 2E

212 8 Bit 'A5' Pattern

| Binary | Hex |
|---|---|
| 10101010 | AA |
| 01010101 | 55 |
| 10101010 | AA |
| 01010101 | 55 |

FIGURE 2F

214 16 Bit 'A5' Pattern

| Binary | Hex |
|---|---|
| 1010101010101010 | AAAA |
| 0101010101010101 | 5555 |
| 1010101010101010 | AAAA |
| 0101010101010101 | 5555 |

FIGURE 2G

216 4 Bit 'Checkerboard' Pattern
```
0001
1110
0010
1101
0100
1011
1000
0111
```

FIGURE 2H

218 8 Bit 'Checkerboard' Pattern
```
00000001
11111110
00000010
11111101
00000100
11111011
00001000
11110111
00010000
11101111
00100000
11011111
01000000
10111111
10000000
01111111
```

FIGURE 2I

DIAGNOSTIC MEMORY INTERFACE TEST

BACKGROUND OF THE INVENTION a. Field of the Invention

The present invention pertains generally to tests of computer processors and specifically to strenuously exercising specific portions of processors.

b. Description of the Background

Memory tests are common diagnostic tools used by engineers to test various computer designs. Common memory tests involve writing a known pattern to a block of memory, reading the block again, and evaluating whether or not a bit has changed. A successful test would be one in which every bit was correctly set.

Memory tests are generally performed to validate the proper functionality of the memory. It is critical for the proper function of a computer system that the memory is reliable and as such, each bit that is set in the memory should function exactly as expected. Thus, memory tests generally involve exercising each and every bit and validating proper functioning.

Common practice has been to perform a standard memory test to evaluate the performance of all components involved in handling memory. The assumption was that if the test passed, each component functioned properly, including the processor, internal bus, memory controller, and individual memory components. While this is nominally acceptable, individual elements may not be stressed completely and thus design flaws or component failures may not be fully uncovered.

It would therefore be advantageous to provide a system and method for stressing certain elements such as the memory interfaces of a computer system as completely as possible.

SUMMARY OF THE INVENTION

The present invention overcomes the disadvantages and limitations of the prior art by providing a system and method for stressing the various memory handling interfaces of a computer system. A set of patterns of data is loaded into memory prior to running a test. Then a test is performed wherein the various patterns of data are transferred at maximum speed from one area to another. Any computation of the microprocessor is minimized so that the various memory components and data transfer components are stressed as much as possible. The data contains patterns that are designed to stress various bus widths during the course of the test, thereby stressing each section as completely as possible. Further, several patterns of data may be used to stress the system in various manners.

The present invention may therefore comprise a method of testing a data interface in a microprocessor of a computer system comprising: defining a base pattern comprising a series of values, the values having a width that is an integer number of bytes; creating a plurality of the patterns having different widths using the base pattern so that at least one of the widths is equal to the width of a first interface to be tested; storing the plurality of patterns into random access memory; executing an interface test algorithm using the plurality of patterns in the random access memory; comparing the results of the algorithm with an expected value; and generating a report.

The present invention may further comprise a data interface test for a microprocessor of a computer system comprising: a base pattern comprising a series of values, the values having a width that is an integer number of bytes; a plurality of the patterns of different widths created using the base pattern wherein at least one of the widths is equal to the width of a first interface to be tested, the plurality of patterns stored into random access memory; an interface test algorithm that uses the plurality of patterns in the random access memory; and a comparison algorithm that compares the results of the algorithm with an expected value and generates a report.

The advantages of the present invention are that the various functions of a microprocessor system may be isolated and exercised as strenuously as possible. Further, the dynamic response of the systems may be characterized by the use of tailored patterns that are created in multiple widths to effectively exercise multiple interfaces.

BRIEF DESCRIPTION OF THE DRAWINGS

In the drawings,

FIGS. 2A–2I are illustrations of various test patterns that may be used as part of the present inventive process.

DETAILED DESCRIPTION OF THE INVENTION

Figure 1:
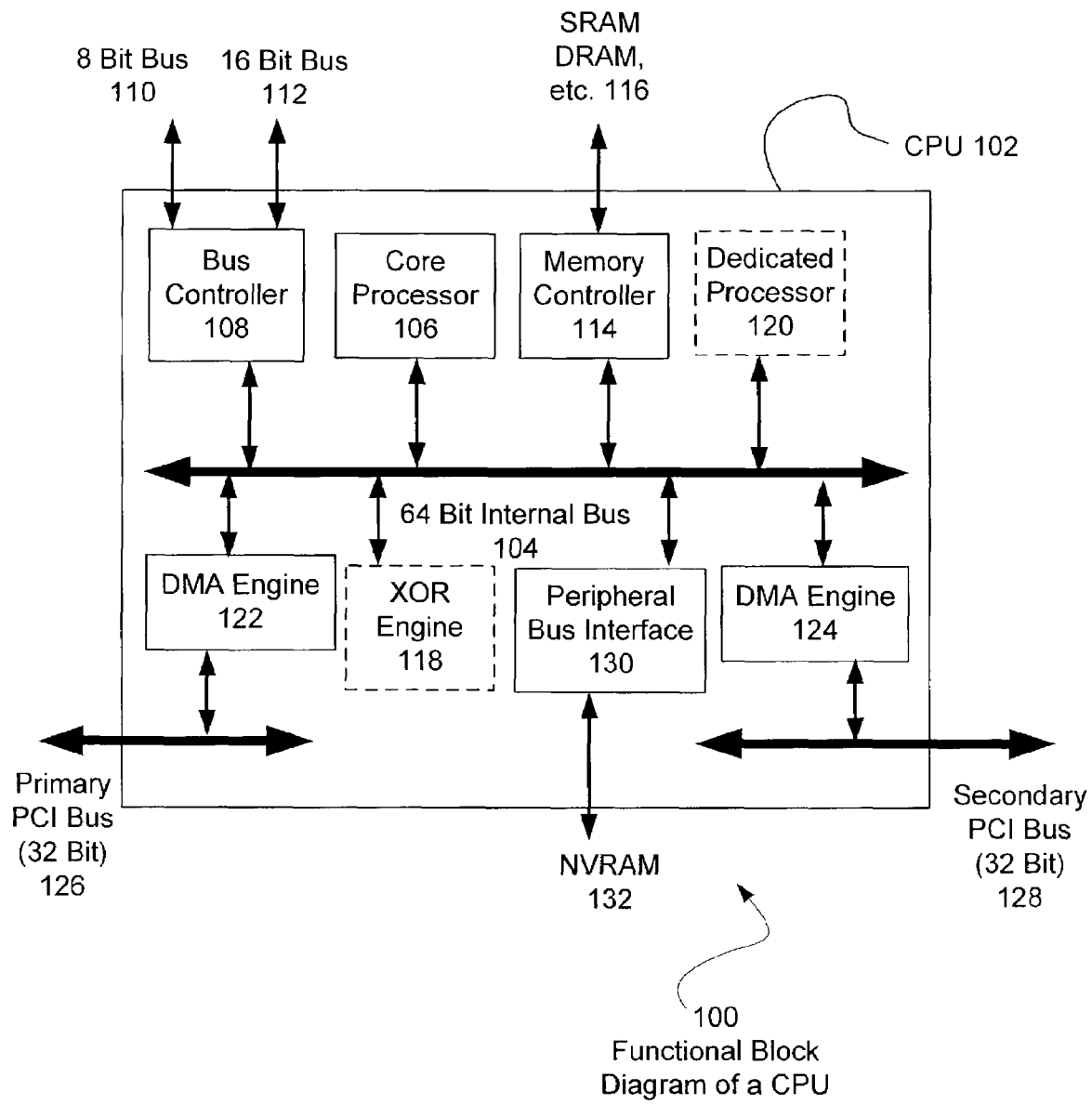
FIG. 1 is an illustration of a functional block diagram of a central processor unit.

FIG. 1 illustrates a functional block diagram 100 of a central processor unit (CPU) 102. The CPU has an internal 64 bit wide bus 104, and a core processor 106. A bus controller 108 interfaces to an 8 bit bus 110 and a 16 bit bus 112. A memory controller 114 is connected to various forms of external memory 116. A dedicated XOR engine 118 and other dedicated processors 120 may also be connected to the internal bus 104. Direct memory access (DMA) engines 122 and 124 are connected to primary and secondary PCI busses 126 and 128. A peripheral bus interface 130 may connect to NVRAM 132 and other devices.

The diagram 100 illustrates some of the various components and interfaces that make up a CPU found in various computing devices. Some embodiments of the CPU 102 may not include all of the various components while other embodiments may have additional components. CPUs may have many different busses and interfaces that operate at various bus widths and speeds. For example, the internal bus 104 in the present embodiment is 64 bits wide, while the bus controller 108 may interface to an 8 bit wide bus 110 or a 16 bit wide bus 112. Likewise, the DMA 122 interfaces to a PCI bus 126 that is 32 bits wide.

During the testing of these various interfaces, it is important to be able to exercise the interfaces a much as possible. Standard test patterns may be used to test various interfaces. These patterns are generally designed to exercise the interfaces and components in various fashions but may perform differently on various interface widths.

FIGS. 2A through 2I illustrate various test patterns. A 4 bit walking 1 pattern 202 and 8 bit walking 1 pattern 204 are shown with the corresponding 4 and 8 bit walking 0 patterns 206 and 208. The walking 1 or walking 0 patterns increment a toggled bit across each column as the series progresses.

A5 patterns are illustrated in 4 bit 210, 8 bit 212, and 16 bit 214 representations. The A5 pattern is so named because the hexadecimal representation of the pattern is A5. The A5 pattern is characterized by large numbers of alternating bits, with each bit being changed at every clock cycle. The A5 pattern is a particularly stressful pattern as it can be used to generate a lot of noise in the system due to the alternating series. Additionally, each bit must be toggled with each clock series.

The checkerboard pattern is illustrated in 4 bit width 216 and 8 bit width 218. The checkerboard pattern combines a walking 1 pattern interlaced with a walking 0 pattern. The checkerboard pattern causes most of the bits to be flipped with each cycle, but does not cause the same amount of noise as the A5 series.

Each pattern may be created in different widths. For a typical microprocessor, data busses may be 8 bits up to 64 bits wide or even wider. The patterns illustrated in FIG. 2 are representative of a specific pattern, but may not be specifically useful with today's microprocessor. Those skilled in the art will appreciate that the particular patterns may be created in various widths. Further, additional patterns may be useful in testing certain functionality of data interfaces while still maintaining within the scope and intent of the present invention.

Figure 3:
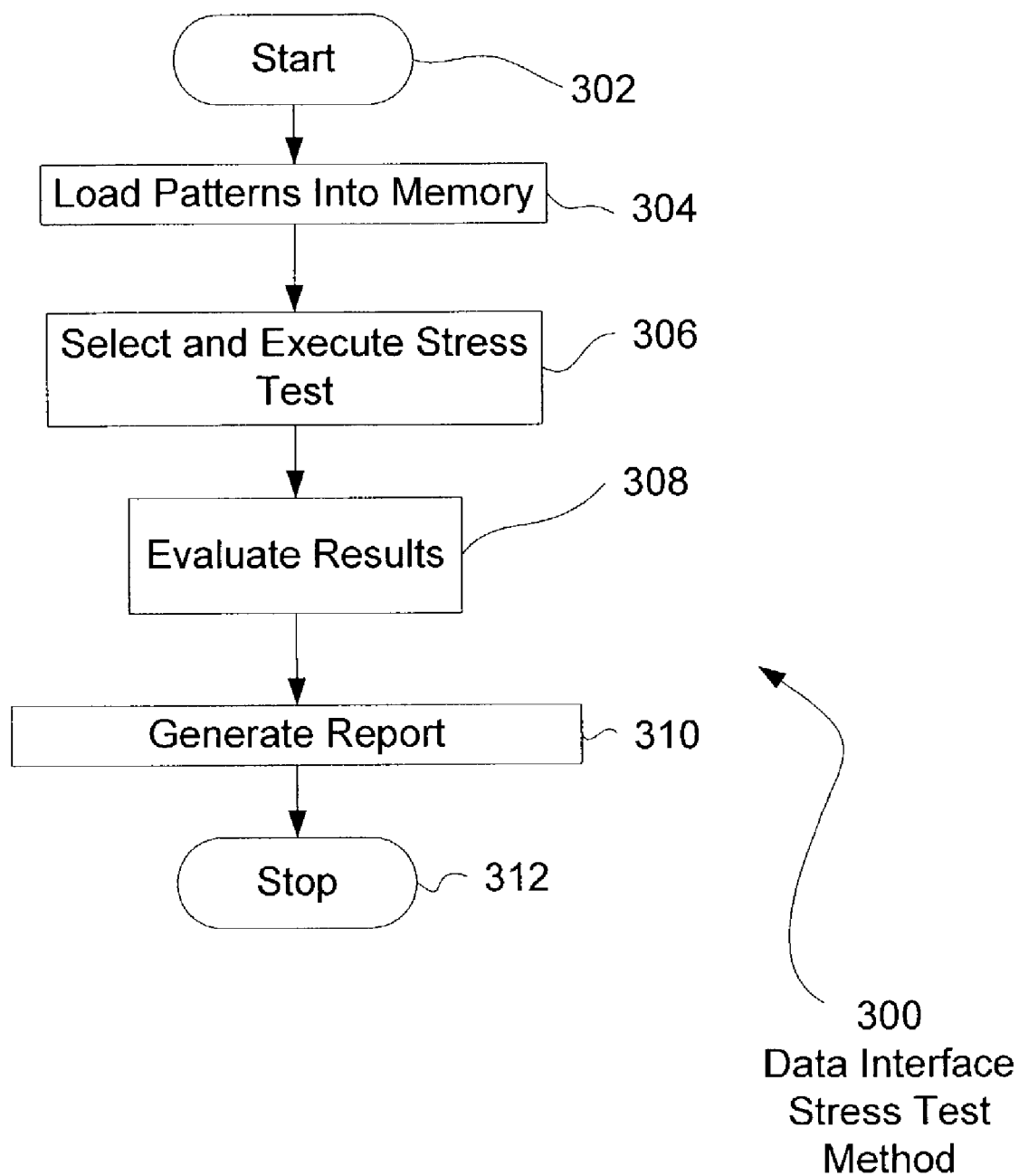
FIG. 3 is an illustration of a work flow diagram of an embodiment of a method of a data interface stress test.

FIG. 3 illustrates a work flow diagram of a method 300 illustrating the steps for performing a data interface stress test. The process is started at step 302 and patterns are created and loaded into memory at step 304. A particular stress test is executed at step 306, the results are evaluated at step 308, and a report is generated at step 310 after which the process is stopped at step 312.

The test patterns are copied from one location to another as quickly as possible. The intent is to stress a particular function or interface by transferring as much data in the form of the various patterns from the random access memory to another location. Because the patterns are already located in random access memory, the patterns can be instantly transferred with a minimum of computation cycles from the core processor. In some cases, it may be possible to complete the test with no computation cycles during the data transfer process.

In standard memory tests, a pattern may be computed at the time it is written to a memory location. Such a process generally is not fast as possible since clock cycles are consumed in the computation. As such, a portion of a pattern may be created in one or more clock cycles and transferred in a subsequent cycle. Then, another portion may be created and so forth. The net result is that the data may not be transferred in succeeding clock cycles. The general intent of common memory tests and the like are to ensure the components are functioning properly.

The method 300 uses pre-loaded patterns to stress various interfaces. Since no computational cycles are required to create the pattern, transfers may occur at every sequential clock cycle. The transfer interface may form a bottleneck and thus be highly stressed during the test. The method 300 may be used to determine dynamic characteristics of components of the processor system. The dynamic characteristics include the effects of operating interfaces and components at the highest speed possible.

For example, the A5 pattern described above can induce a large amount of noise into a system as the pattern comprises alternating 1's and 0's. The A5 pattern also is designed to flip all of the registers at each successive transfer. The transfer of the AS pattern at every successive transfer may produce a worst case dynamic exercise of elements of the processor such as the data transfer interfaces. Errors may occur with the method 300 that were otherwise undetectable with the prior art, since the prior art was not directed at dynamic effects.

The stress test 306 may be any test directed at stressing a particular interface or functionality of a computer system. Specifically, the method 300 is adapted to stressing data handling interfaces such as memory management, direct memory access (DMA) engines, specialty processors such as XOR engines or other dedicated processors, data bus interfaces, or other interfaces and functional blocks.

The method 300 may be performed on multiple patterns consecutively. Further, each pattern may contain multiple widths. Multiple widths of patterns may be used to stress various portions of a data transfer path. For example, a complete pattern block may include an 8 bit width, a 16 bit width, a 32 bit width, and a 64 bit width. When the data pattern block is transferred to another element within the processor, the data may flow through a 64 bit internal bus, a 32 bit interface, and then be transferred to an 8 bit wide interface bus. During the transfer, the 8 bit width section may stress the 8 bit wide interface but not thoroughly stress the 32 bit or 64 bit interfaces. Likewise, the 32 bit width section of the pattern may stress the 32 bit interface but not the 64 bit bus or the 8 bit interface.

Figure 4:
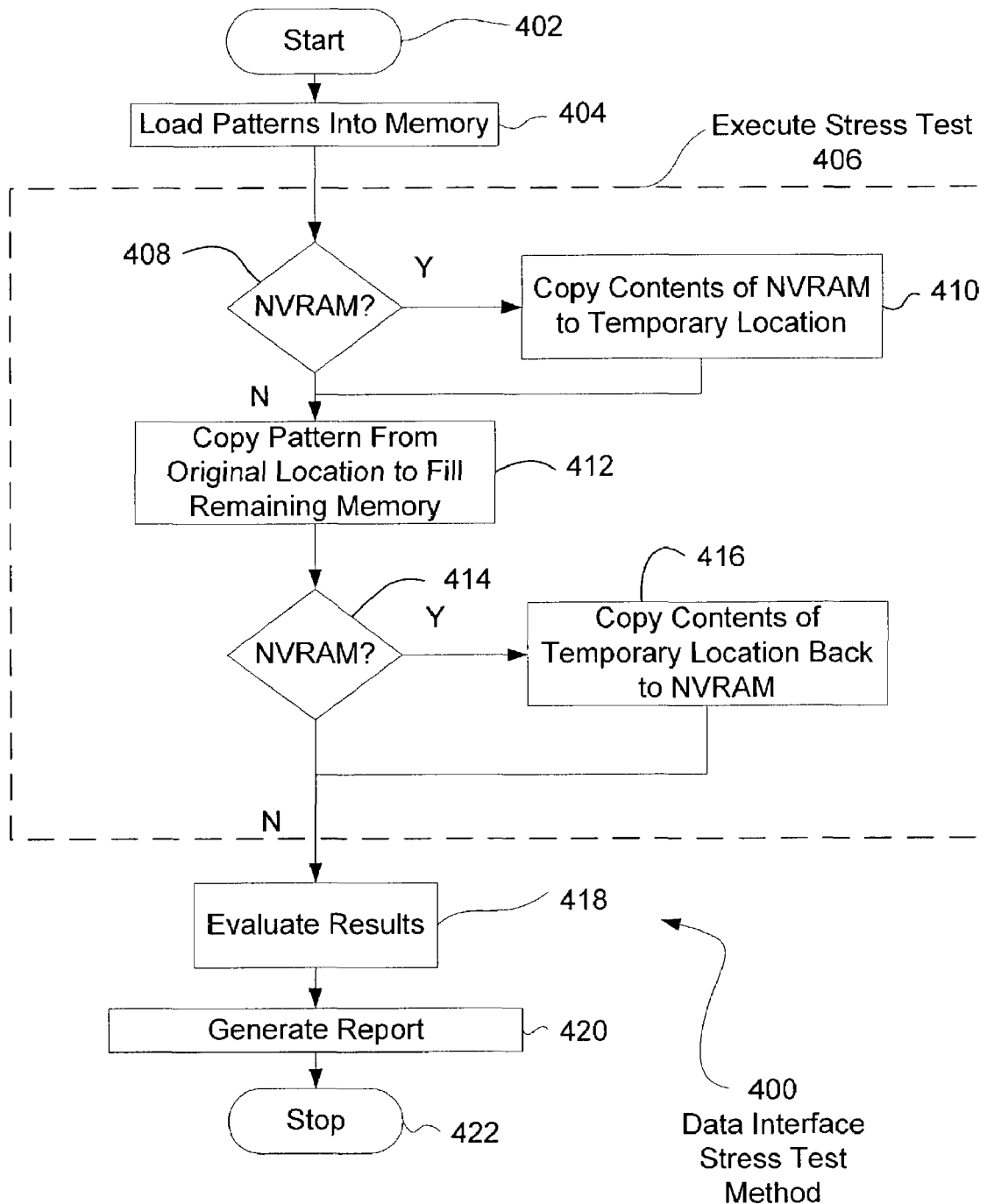
FIG. 4 is an illustration of a flow diagram of an embodiment of the present invention showing a method of performing a memory interface stress test.

FIG. 4 is a flow diagram of an embodiment of the method 400 of performing a memory interface stress test. The process is started at step 402 and patterns are loaded into memory at step 404. The stress test at step 406 comprises checking at step 408 if the test is for non-volatile random access memory (NVRAM). If so, the data located in NVRAM is copied at step 410 to another storage location for the duration of the test. Copying the pattern from the original location to fill the memory at step 412 performs the actual stress test of the data interface. At step 414, if the memory to be tested is NVRAM, the original contents of the NVRAM are restored at step 416. The results are evaluated at step 418, a report generated at step 420, and the process is stopped at step 422.

The present method 400 exercises the data interface that handles memory access. Because the patterns are loaded into RAM at step 404 at the start of the process, no additional computations are required by the processor, thus enabling the transfer of patterns at the highest speed possible.

In the case where the RAM to be tested is also storing the patterns, any unused RAM may be filled to capacity by transferring the patterns to the empty area of RAM. In the prior art tests of the functionality of the RAM components, the entire space of RAM would commonly be tested. Such tests may not exercise the transfer of data at the highest speeds possible as the patterns are typically calculated at the time they are transferred.

In some embodiments, the contents of the memory may be temporarily relocated, as illustrated with the NVRAM in FIG. 4. In these cases, the non-volatile RAM may contain data that is critical to the functioning of the system and thus needs to be restored after the inventive test is completed. In other cases, the NVRAM might be nearly fully utilized and may not have enough unused space for the inventive test to yield meaningful results.

Figure 5:
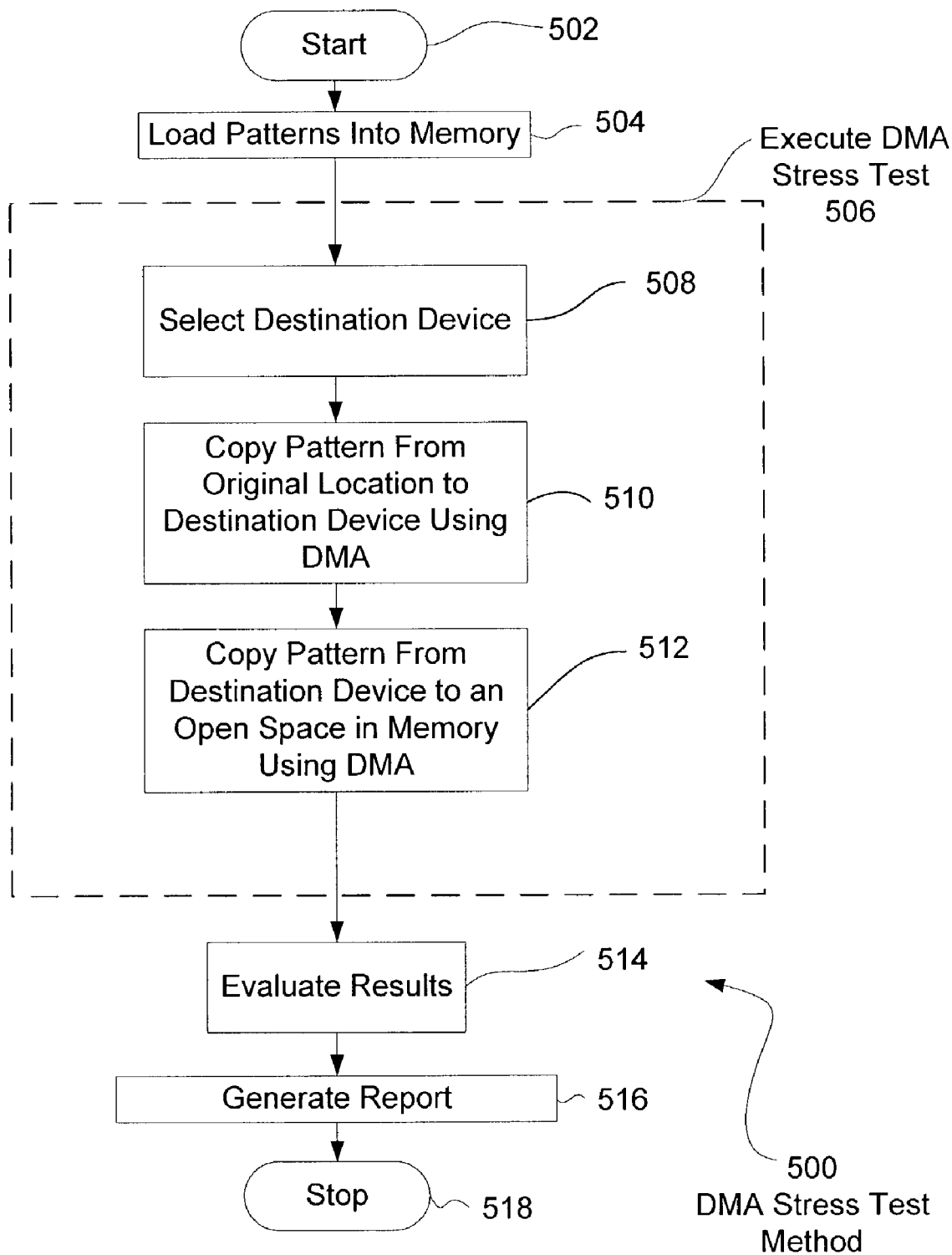
FIG. 5 is an illustration of a flow diagram of an embodiment of the present invention directed to the testing of a direct memory access (DMA) engine.

FIG. 5 illustrates a flow diagram of an embodiment 500 of the present invention directed to the testing of a direct memory access (DMA) engine. The process is started 502 and patterns are loaded into memory 504. The DMA stress test 506 comprises selecting a destination device 508, copying the pattern from the original location to the destination device using the DMA 510, then the pattern is copied back 512, evaluated 514, and a report is generated 516 before stopping 518. The evaluation routine 514 may compare the original pattern bit by bit with the pattern that is placed in memory in step 512. Any discrepancies would be noted on the report. Such discrepancies may include the bits that were in question and their position in the particular pattern, which may lead an engineer to identify certain characteristics of the processor that may need refining.

Figure 6:
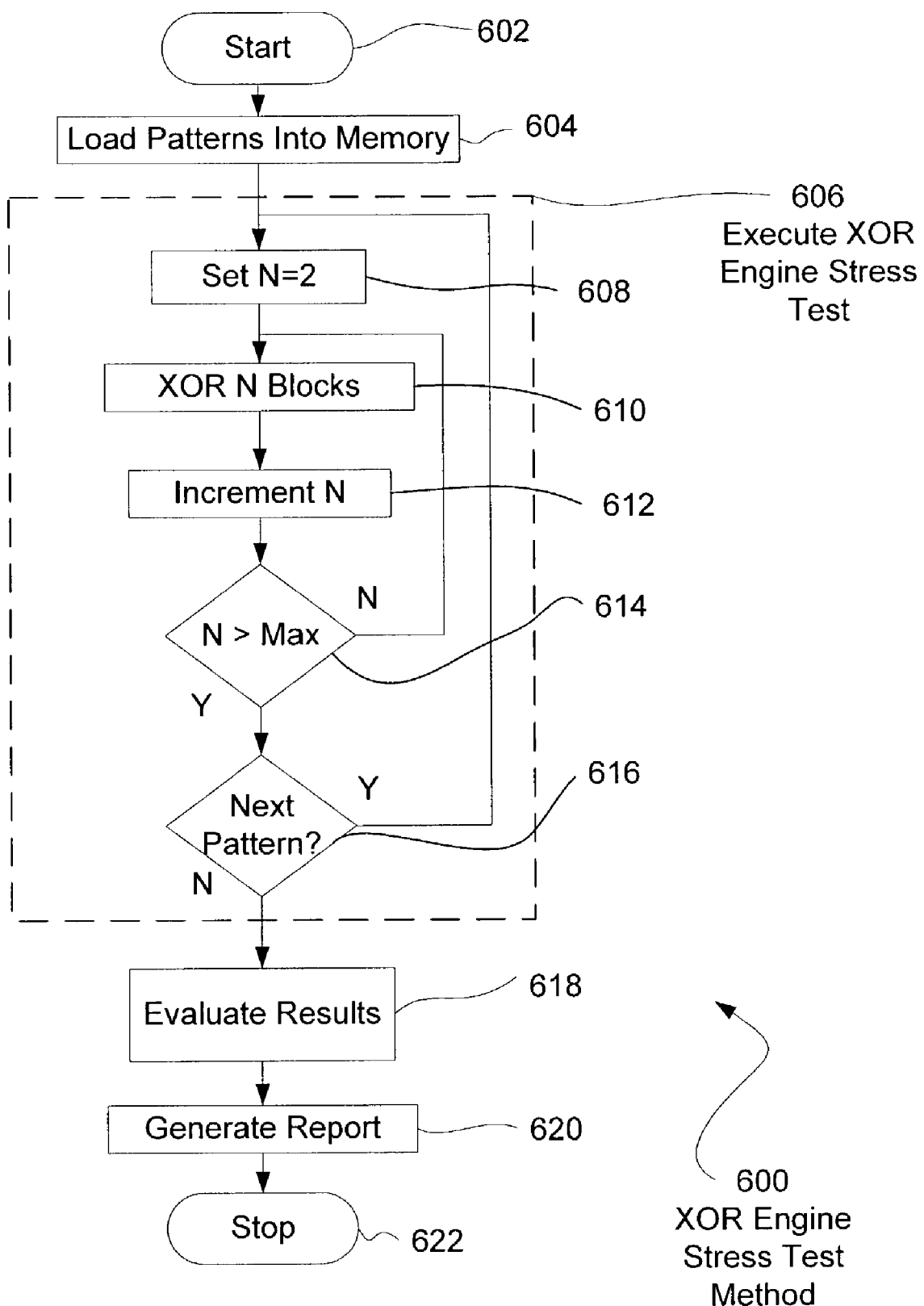
FIG. 6 is an illustration of a flow diagram of an embodiment of the present invention showing a method of exercising an XOR engine.

FIG. 6 illustrates a flow diagram of an embodiment 600 of the present invention that illustrates a method for exercising an XOR engine. The process is started in step 602 and the patterns are loaded into memory in step 604. The XOR engine stress test 606 comprises setting N to 2 in step 608, performing the XOR function on N blocks of the pattern in step 610, incrementing N in step 612, if N is less than the maximum number of blocks capable of being XOR'ed in step 614, another XOR function is executed. If N has exceeded the maximum in step 614, another pattern may be executed in step 616. The results are evaluated in step 618 by calculating the expected XOR values with a different computational engine such as the core processor, a report generated in step 620, and the process stopped in step 622.

In general, it is preferred that the present invention be executed in a microprocessor when no other programs or processes are running in the microprocessor. The preferred embodiment of the present invention has as little overhead and additional computation as possible during the execution of the stress tests. Timer and counter routines, and other functions that may be used to measure performance of the tests may not be present during the actual stress tests so that the maximum speed of data transfer may be reached during the test.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of testing a data interface in a microprocessor of a computer system comprising:
    defining a base pattern comprising a series of values, said values having a width being an integer number of bytes;
    creating a plurality of said patterns of different widths using said base pattern wherein at least one of said widths is equal to the width of a first interface of the microprocessor to be tested;
    storing said plurality of patterns into random access memory;
    executing an interface test algorithm using said plurality of patterns in said random access memory;
    comparing the results of said algorithm with an expected value; and
    generating a report.

2. The method of claim 1 wherein a second of said widths is equal to a second interface to be tested.

3. The method of claim 1 wherein said interface test comprises copying said plurality of patterns from said random access memory to unused portions of said random access memory.

4. The method of claim 1 wherein said interface test comprises copying said plurality of patterns from said random access memory to unused portions of a non-volatile random access memory.

5. The method of claim 1 wherein said interface test comprises copying said plurality of patterns from said random access memory to another memory location using a direct memory access engine.

6. The method of claim 1 wherein said base pattern comprises a walking 1 pattern.

7. The method of claim 1 wherein said base pattern comprises a walking 0 pattern.

8. The method of claim 1 wherein said base pattern comprises a repeating hexadecimal A and hexadecimal 5.

9. A data interface test for a microprocessor of a computer system comprising:
    a base pattern comprising a series of values, said values having a width being an integer number of bytes;
    a plurality of said patterns of different widths created using said base pattern wherein at least one of said widths is equal to the width of a first interface of the microprocessor to be tested, said plurality of patterns stored into random access memory;
    an interface test algorithm that said plurality of uses patterns in said random access memory; and
    a comparison algorithm that compares the results of said algorithm with an expected value and generates a report.

10. The test of claim 9 wherein a second of said widths is equal to a second interface to be tested.

11. The test of claim 9 wherein said interface test algorithm comprises copying said plurality of patterns from said random access memory to unused portions of said random access memory.

12. The test of claim 9 wherein said interface test algorithm comprises copying said plurality of patterns from said random access memory to unused portions of a non-volatile random access memory.

13. The test of claim 9 wherein said interface test algorithm comprises copying said plurality of patterns from said random access memory to another memory location using a direct memory access engine.

14. The test of claim 9 wherein said base pattern comprises a walking 1 pattern.

15. The test of claim 9 wherein said base pattern comprises a walking 0 pattern.

16. The test of claim 9 wherein said base pattern comprises a repeating hexadecimal A and hexadecimal 5.

* * * * *